United States Patent [19]

Densham et al.

[11] Patent Number: 5,765,219
[45] Date of Patent: Jun. 9, 1998

[54] APPARATUS AND METHOD FOR INCREMENTALLY ACCESSING A SYSTEM MEMORY

[75] Inventors: Rodney Hugh Densham, Charlbury; Christopher Michael McCulloch, Chipping Norton; Peter Charles Eastty, Oxford, all of United Kingdom

[73] Assignees: Sony Corporation, Tokyo, Japan; Sony United Kingdom Limited, Weybridge, United Kingdom

[21] Appl. No.: 598,539

[22] Filed: Feb. 8, 1996

[51] Int. Cl.$^6$ .................................................. G06F 13/00
[52] U.S. Cl. ................ 711/220; 711/216; 711/217; 711/218; 711/219; 364/DIG. 1
[58] Field of Search ................. 395/421.06, 421.07, 395/421.08, 421.09, 421.1

[56] References Cited

U.S. PATENT DOCUMENTS

| | | | |
|---|---|---|---|
| 4,727,481 | 2/1988 | Aguille et al. | 395/421.07 |
| 4,833,602 | 5/1989 | Levy et al. | 395/421.07 |
| 5,214,611 | 5/1993 | Shigehara et al. | 365/236 |
| 5,276,827 | 1/1994 | Delaruelle et al. | 395/421.07 |
| 5,319,759 | 6/1994 | Chan | 395/421.07 |
| 5,377,340 | 12/1994 | Seroussi et al. | 395/421.06 |
| 5,636,224 | 6/1997 | Voith et al. | 395/421.09 |

FOREIGN PATENT DOCUMENTS

| | | |
|---|---|---|
| 0447266A2 | 9/1991 | European Pat. Off. |
| 975751 | 11/1964 | United Kingdom. |
| 1207169 | 9/1970 | United Kingdom. |

*Primary Examiner*—Frank J. Asta
*Attorney, Agent, or Firm*—Frommer Lawrence & Haug LLP; William S. Frommer

[57] ABSTRACT

Data storage apparatus comprises: a memory having a plurality of addressable memory locations for storage of data items and memory address input means for receiving addresses of locations to be accessed; main input means for receiving an input address corresponding to a memory location; a counter for changing a count in response to a clock signal; address adjustment means for combining the count with an input address to generate an adjusted address corresponding to a memory location and supplying the adjusted address to the memory address input means; and means for accessing the memory location at the address supplied to the memory address input means. Also provided is a data storage method, and data processing systems including the data storage systems.

46 Claims, 4 Drawing Sheets

APPARATUS AND METHOD FOR INCREMENTALLY ACCESSING A SYSTEM MEMORY

BACKGROUND OF THE INVENTION

FIELD OF THE INVENTION

This invention relates generally to data processing, and in particular relates to data storage apparatus and methods and data processing systems including same.

The invention will be illustrated hereinafter with reference to one particular application in the field of digital audio data processing. However, it is to be understood that the invention finds applications in many other fields.

In signal processing apparatus for processing digital audio data, for example in the signal processing rack of an audio recording studio, it has been proposed for the necessary processing to be performed by an array of data processors of substantially identical structure. Each data processor, or signal processing integrated circuit (SPIC), includes a number of data memories, an arithmetic logic unit (ALU), a multiplier and a system of multiplexers to enable the SPIC to perform various processing operations on data received from the array buses or on data stored in the internal data memories. Each SPIC also includes a program memory in which is stored a sequence of instructions. The SPIC runs through the complete sequence of instructions once in each audio sample period to perform the processing operations indicated by the instructions. Thus, in successive audio sample periods, the SPIC repeats the same series of processing operations in accordance with the instruction sequence, though of course the actual data items on which the operations are performed will vary from sample to sample.

For those operations which require read or write accesses to the internal memories of the SPIC, the instructions stored in the program memory contain addresses defining the locations to be accessed in the data memories. Since the SPIC is preprogrammed with the instruction sequence, these addresses, for most purposes at least, are fixed. That is, the addresses indicated by a particular instruction will not be varied during operation of the system, so that when a particular instruction requiring access to the data memories is performed in successive audio sample periods, the same data memory location will be accessed. Under these circumstances, if a particular data item is written to a data memory by an instruction in one audio sample period, the corresponding data item in the next audio sample period, e.g. a new audio sample, will be written to the same memory location. The data item is therefore overwritten by the corresponding data item in the next sample period.

There will of course be operations which require access to corresponding data items in different sample periods. For example, as part of their operation the SPICs need to be able to implement various multi-tap or multi-pole filters which operate on the audio data. In order to implement the filter operations, the SPICs need to access data generated during a number of successive audio sample periods. However, as described above, since the addresses defined by the instructions do not vary from sample to sample, data items written to the memories will be successively overwritten by the corresponding data items in successive audio sample periods.

A solution to this problem is to include in the instruction sequences instructions to copy data from one memory location to another. For example, if one instruction writes a current data item to a first memory location specified by the address in the instruction, a further instruction later in the instruction sequence may copy data from the first location to a second location. Considering this to be done in a first sample period, then after the WRITE instruction has been performed in the second sample period, the new data item is available at the first memory location and the corresponding previous data item is available at the second data location. Both data items are therefore available until the COPY instruction is performed in the second sample period. Thus, both data items are available for use by instructions between the WRITE and COPY instructions in the instruction sequence. In practice, however, since the operation of the SPIC is pipelined, not all of the instructions between the WRITE and COPY instructions will be able to access both data items.

While the above example illustrates how a data item from a given sample period can be made available at the same time as the corresponding data item in the immediately next sample period, this is of course a particularly simple example. It will be appreciated that, for the implementation of the various filters required in actual operation of the apparatus, the system of copying data between memory locations can become exceedingly complex. As well as placing severe constraints on the programming operation, the copying system is also wasteful of the processing resources of the SPICs since instructions must be allocated to copying operations.

SUMMARY OF THE INVENTION

In accordance one aspect of the present invention there is provided data storage apparatus comprising:

a memory having a plurality of addressable memory locations for storage of data items and memory address input means for receiving addresses of locations to be accessed;

main input means for receiving an input address corresponding to a memory location;

a counter for changing a count in response to a clock signal;

address adjustment means for combining the count with an input address to generate an adjusted address corresponding to a memory location and supplying the adjusted address to the memory address input means; and means for accessing the memory location at the address supplied to the memory address input means.

With this data storage apparatus, therefore, the actual address in a memory to which a data item is written can be made dependent upon the count held by the counter at that point in time. As the count changes, so the address to which data is written changes even though the same input address may be supplied to the main input means. In the particular example of the audio processing system described above, therefore, if the clock signal corresponds to the audio sample clock, even though the same address is generated by an instruction in successive audio sample periods, the data storage apparatus can be applied to write corresponding data items to different addresses in successive sample periods. In this example therefore, corresponding data items in successive sample periods are made available in the memory without the need for COPY instructions.

The counter is preferably incremented with successive cycles of the sample clock signal, and the address adjustment means is preferably arranged to add the count to an input address. In this case, if the same input address is used in successive cycles of the clock signal, data will actually be written to successive addresses in the memory. Thus, if corresponding data items in successive clock cycles are supplied with the same input address to the memory, the data item for the current clock cycle can be read by a read access using that input address. Further, the data item for the previous clock cycle can be read using a read input address obtained by subtracting 1 from the write input address. The data item for the last but one clock cycle can be read using a read input address obtained by subtracting 2 from the write input address, and so on.

The counter is preferably a modulo-n counter where n is the number of locations in the memory. Since there are only a given number of locations in the memory, depending on the input address for a memory access and the current value of the count, the address value obtained by combining the count with the input address may be outside the range of actual memory location addresses. Thus, the address adjustment means preferably includes mapping means for receiving the address value obtained through combining the count with the input address and, if the address value is outside the range of memory location addresses, converting the address value to an adjusted address corresponding to a memory location. In particular, where the count is added to the input address, if the resulting address value is greater than the highest address of a memory location, the mapping means may reduce the address value by the number of locations in the memory until an adjusted address corresponding to a memory location is obtained. This effectively treats the available memory locations as a continuous cycle, 0, 1 ... n−1, n, 0, 1 etc., so that an address value of n+1 maps to adjusted address 0, an address value of n+2 maps to adjusted address 1, and so on.

In many applications, it may be desirable for only part of the memory to be addressed as described above by generating from an input address an adjusted address which changes in dependence on a clock signal. It may also be desirable for another part of the memory to be accessible using the input addresses directly. For example, in the audio processing application described above, some memory locations may be used for storing constants or other data items for which preceding values are not required. Thus, only a section of the memory may be adjustably addressed. In such a case, the main input means may include means for identifying whether an input address corresponds to a location in a first section (the adjustably addressed section) of the memory, and may be arranged to supply input addresses corresponding to locations in the first section to the address adjustment means, and to supply other input addresses to the memory address input means for direct accessing of the memory. Here, the counter is conveniently a modulo-p counter where p is the number of locations in the first section of the memory. Again, the address adjustment means preferably includes mapping means for converting an address value which is outside the range of addresses in the first section to an adjusted address corresponding to a location in that section. Here, for example, if the address value is greater than the highest address in the first section, the mapping means may reduce the address value by the number of locations in that section to produce the adjusted address, thus treating the memory locations within that section cyclically as described earlier.

Where the memory or a section thereof is adjustably addressed, it may be desirable to be able to switch between an adjustable addressing mode and a direct addressing mode. Thus, the apparatus may include bypass means for switching out the address adjustment means in response to a control signal such that input addresses output by the main input means to the address adjustment means are supplied directly (i.e. unmodified by the count) to the memory address input means.

In a preferred embodiment, the memory comprises a plurality of sections each of which can be adjustably addressed. Here, address adjustment means may be provided for each section (separately or in common for one or more sections depending on the particular arrangement), and the main input means may include means for identifying the section of the memory containing the location corresponding to an input address and supplying the input address to the adjustment means for that section. For each section, the count for adjusting the input address may be provided by a modulo-p counter where p is the number of locations in that section.

Since the amount of adjustably addressable memory space may vary with requirements, bypass means are preferably provided for at least some, and preferably all, of the sections to switch out the adjustment means. The bypass means for each section may be responsive to a control signal for that section the state of which determines whether the section is adjustably, or directly, addressed.

Embodiments of the invention also provide a data processor for processing digital data samples including at least one data storage apparatus as described above. The count of the or each counter may be incremented by the data sample clock signal, and each processor may be arranged to perform a sequence of operations in each period of the clock signal in accordance with a sequence of instructions stored in a program store of the processor, at least some of the instructions including address data corresponding to input addresses to be supplied to the data storage apparatus.

The invention also provides a method for accessing a memory having a plurality of addressable memory locations for storage of data items, the method comprising:

generating an input address corresponding to a location of the memory;

changing a count in response to a clock signal;

combining the input address with the count to generate an adjusted address corresponding to a memory location; and accessing the memory location corresponding to the adjusted address.

In general, it is to be understood that, where features are described herein with reference to an apparatus embodying the invention, corresponding features may be provided in accordance with a method embodying the invention, and vice versa.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
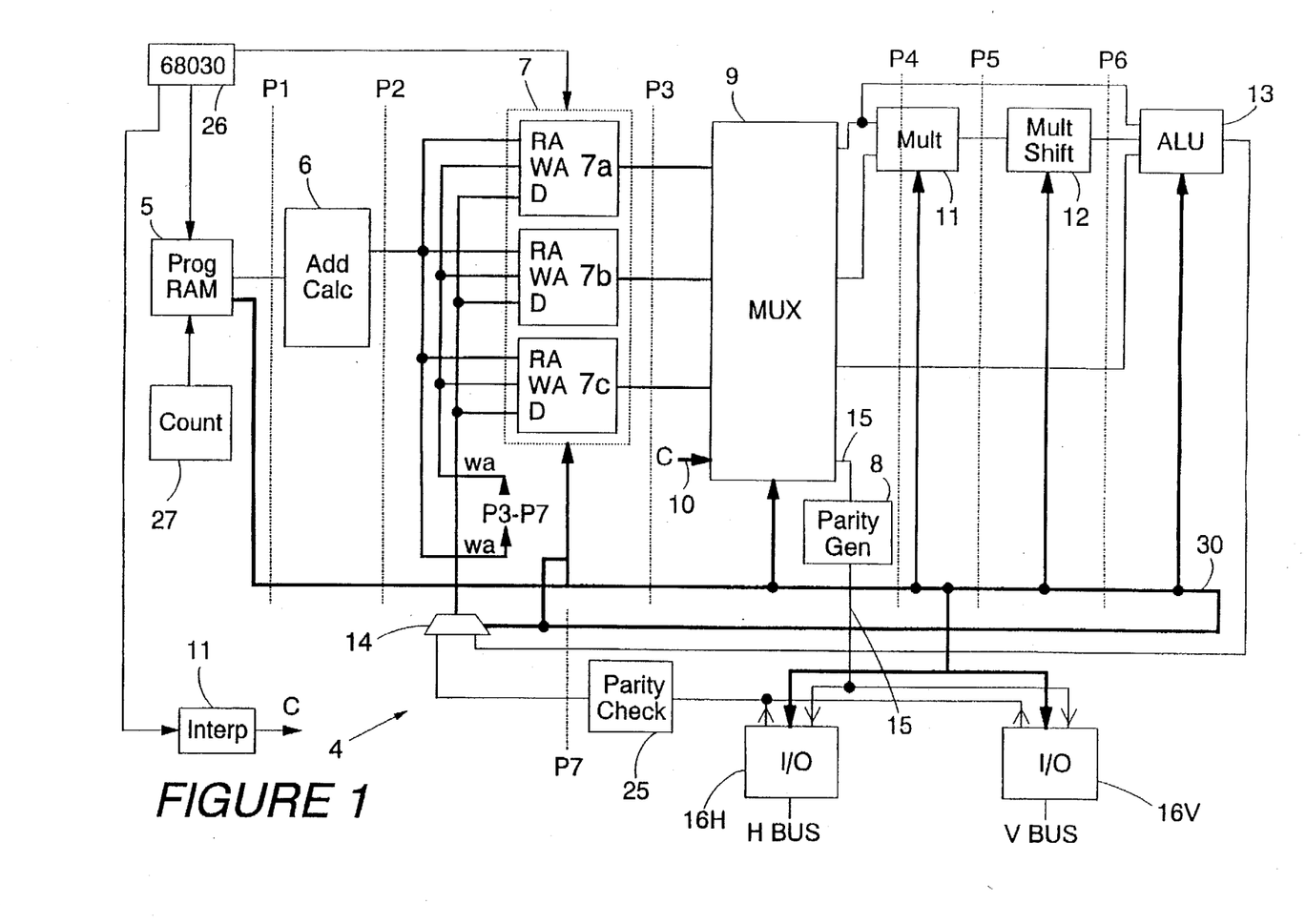
FIG. 1 is a schematic block diagram illustrating the general structure of a data processor employing data storage apparatus embodying the invention.

FIG. 1 is a simplified block diagram showing the general structure of a data processor, or SPIC, 4 employing data storage apparatus embodying the invention. In the application to be described, the SPIC 4 is connected with other SPICs 4 in a parallel processing array part of which is illustrated schematically in FIG. 2. The processors 4 are arranged, at least electrically, in a rectangular array, each SPIC being connected to a horizontal data bus H and a vertical data bus V. Each SPIC 4 can communicate data with each of the two buses to which it is connected. The array of SPICs 4 forms the audio processing portion of a signal processing rack 1 in an audio recording studio as illustrated by the simplified block diagram of a FIG. 3. The signal processing rack 1 communicates with an operator console 2 and, as indicated by the LINK & I/O block 3, is also connected into the studio network for communication of audio and control data between the signal processing rack and the various input/output devices, e.g. speakers, microphones, DATs etc., connected to the network link. Operation of the network is controlled at the console, or mixing desk, 2, communication of data between devices in the network and implementation of the necessary processing by the signal processing rack 1 being performed in response to operation of the console controls.

Figure 2:
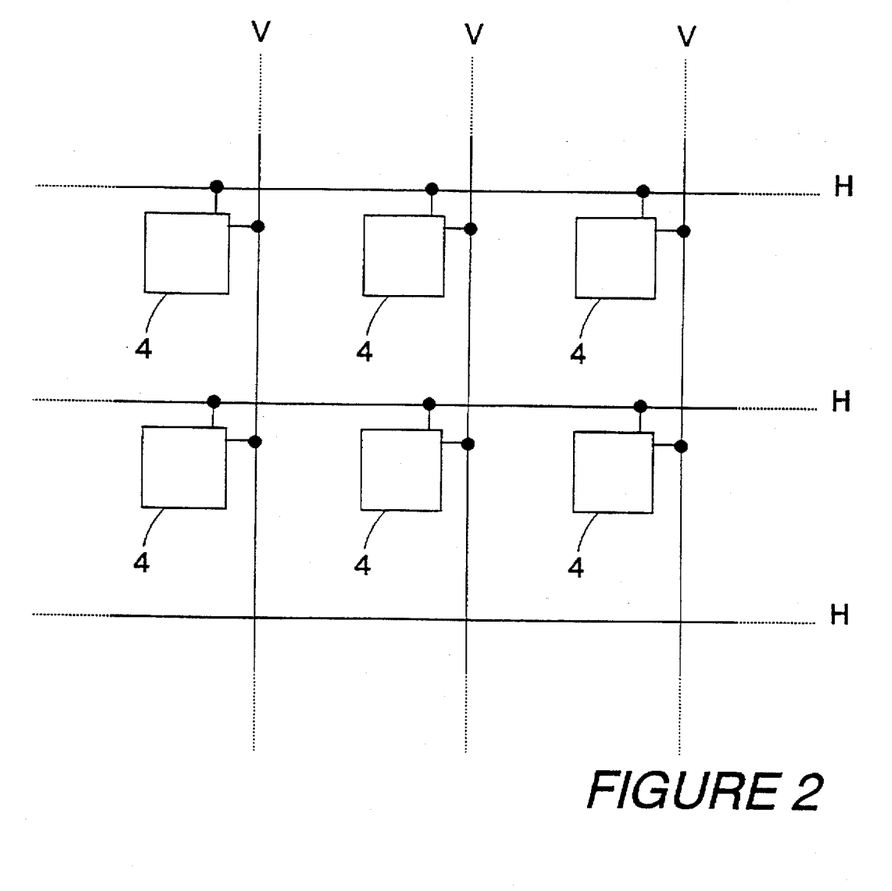
FIG. 2 shows an array of the data processors of FIG. 1.
Figure 3:
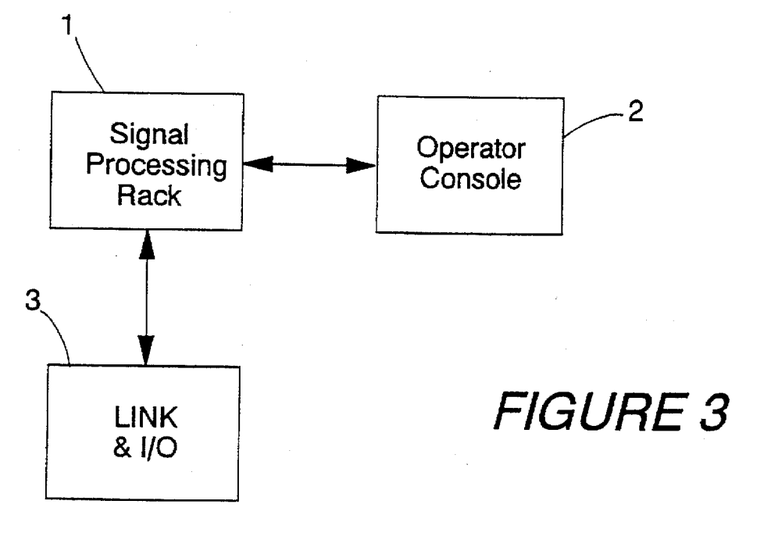
FIG. 3 is a simplified schematic of an audio recording studio including a signal processing rack in which the data processors of FIG. 1 are employed.

The SPICs 4 in the array of FIG. 2 run synchronously, each SPIC performing a sequence of operations in each audio sample period in accordance with an instruction sequence stored in an internal memory. The SPICs are preprogrammed with the instruction sequences at set up so that all possible required processing operations can be implemented by the array. In operation, the SPICs run synchronously through their instruction sequences under control of a control processor which is responsive to the operator console 2.

Returning to FIG. 1, before describing the data storage apparatus of the SPIC 4 in detail, the basic structure and operation of the SPIC will be described.

The SPIC 4 comprises a program RAM 5 in which the instruction sequence for controlling operation of the SPIC is stored. The program RAM 5 is connected to an address calculator 6 which generates the input addresses for a data RAM section, indicated generally at 7, embodying the data storage apparatus to be described in more detail below. The data RAM section 7 comprises three data RAMs 7a, 7b and 7c with respective read and write address inputs RA and WA and data inputs D. The three data outputs from the data RAMs 7 form three of the four inputs to an arrangement of multiplexers indicated generally by the MUX block 9. The fourth input 10 of the MUX block 9 receives coefficients (c) from an interpolator 11 as discussed further below. The MUX block 9 is arranged to enable connection of any of its four inputs to any of its four outputs in dependence on the instruction being performed. The upper two outputs of the multiplexers 9 form the two inputs to a multiplier (mult) 11 the output of which is connected to a multiplier shifter (mult shift) 12 which performs bit shifting of the multiplier output. (For example, if the inputs to the multiplier 11 are 32 bits wide, the multiplier output can be up to 64 bits, and the multiplier shifter 12 selects the required 32 bits to be supplied to its output in accordance with the instruction being performed). The output of the multiplier shifter 12 is supplied to an arithmetic logic unit (ALU) 13. One input of the multiplier 11 is also connected directly to an input of the ALU 13, as is the third output of the multiplexers 9. The output of the ALU 13 is connected to one input of a multiplexer 14 the output of which is connected to the data inputs D of the three data RAMs 7a, 7b and 7c.

The fourth output 15 of the multiplexers 9 is connected via a parity generator 8, which generates parity bits for outgoing data, to first and second I/O (input/output) means 16H and 16V. The I/O means 16H, 16V connect the processor for data transfer with the horizontal and vertical data buses H,V respectively. The output 15 of the multiplexers 9 is connected to the I/O sections 16H, 16V for output of data to the H and V buses. The data inputs from the I/O sections are connected to a parity check unit 25 in which parity checking of data received from the buses is performed. The output of the parity check unit 25 forms a second input to the multiplexer 14.

As previously described, each SPIC 4 in the array (FIG. 2) is programmed at set-up to perform a sequence of operations in each audio sample period in accordance with a sequence of instructions stored in the program RAM 5. In this embodiment, each SPIC 4 can implement 512 such instructions per audio sample period. During set-up, the instructions are written to the program RAMs 5 via a control processor, in this example a 68030 processor 26, a number of which are provided in the signal processing rack, each controlling a group of the SPICs 4 in the array. The control processor 26 is also connected to a coefficient interpolator 11 which generates coefficients (c) to be used in the processing operations of the SPIC in accordance with the setting of the console controls.

In operation of the SPIC, the 512 instructions are sequentially read out of the program RAM 5 in accordance with the clock signal from a counter 27 which generates 512 clock cycles, or "ticks", per audio sample period. All counters 27 are synchronised and triggered to start the tick count by a global "start sample clock" which runs at the audio sampling frequency. Thus, all SPICs in the array progress synchronously through their respective instruction sequences during each audio sample period.

Figure 4:
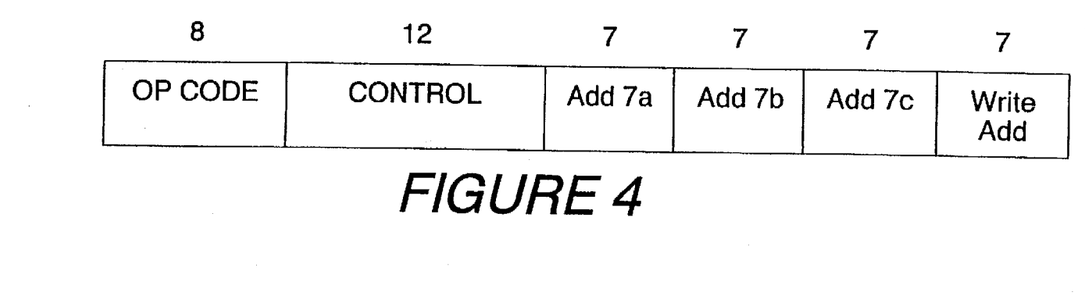
FIG. 4 illustrates the general format of an instruction word for the data processor of FIG. 1.

FIG. 4 illustrates schematically an example of the format of the instruction word for the instructions stored in the program RAM 5. This instruction word is 48 bits long. The first eight bits of the instruction word form the operation code (OP CODE) which indicates the type of instruction, e.g. add data in two of the data RAMs 7, multiply data in one of the data RAMs by a coefficient from the interpolator, and so on. The next 12 bits of the instruction word constitute control data for controlling the internal operation of the SPIC, e.g. for controlling switching in the MUX block 9 and multiplexer 14, enabling of the data RAMs 7, I/O accesses, and so on. The next 28 bits of the instruction word are divided into four 7-bit address fields. The first three address fields represent read addresses for the three data RAMs 7a, 7b and 7c. The last address field represents a write address for writing data to one or more of the data RAMs 7.

Referring again to FIG. 1, as each instruction word is read out of the program RAM 5, the addresses are supplied to the address calculator 6 which decodes the read and write addresses for the data RAMs 7. The remaining instruction data is output to the control line 30 which is shown in bold in FIG. 1. The control line 30 is shown connected to the data RAMs 7, MUX block 9, multiplier 11, multiplier shifter 12, ALU 13, I/O sections 16H, 16V and the multiplexer 14 to control operation of these components in accordance with the instruction word.

The internal hardware of the SPIC 4 is highly pipelined. The pipeline registers are indicated schematically by the dash-dotted lines in FIG. 1 and are labelled P1 to P7. These divide the data and control paths from the program RAM 5, via the data RAMs 7, MUX block 9, ALU 13, and multiplexer 14 back to the data RAMs 7 into eight pipeline stages 0 to 7 as follows:

| Pipeline Stage | Action |
| --- | --- |
| 0 | Program read |
| 1 | Address calculation |
| 2 | Data read |
| 3 | Multiplier 1 |
| 4 | Multiplier 2 |
| 5 | Multiplier shift |
| 6 | ALU |
| 7 | Data write |

Each pipeline stage 0 to 7 corresponds to one tick of the counter 27 which triggers reading of successive instructions from the program RAM 5. Thus, at tick 0 at the start of an audio sample period, instruction 0 is read out of the program RAM 5 to the pipeline register P1. In the next tick, instruction 1 is read out of the program RAM 5 to the pipeline register P1 as address calculation for instruction 0 is performed by the address calculator 6. In successive ticks after this, successive instructions are read out of the program RAM 5 as the instruction data for instruction 0, and data generated by this instruction, propagate through the internal pipeline stages. Transfers between SPICs using the H or V buses also occur with normal pipeline timing through provision of pipeline registers in the I/O sections 16H, 16V and parity checker 25.

Note that read addresses generated by the addresses calculator 6 in pipeline stage 1 are used in the immediately following pipeline stage to access the data RAMs 7, whereas write addresses (wa) generated in pipeline stage 1 are not required until pipeline stage 7. As indicated schematically in FIG. 1, therefore, write addresses wa are supplied on an extension of the address line from pipeline register P2, on through pipeline registers P3 to P7, and appear on the write address inputs WA of the data RAMs 7 in pipeline stage 7. Consider for example an instruction requiring multiplication of data items at respective locations in data RAMs 7a and 7b, and writing of the product to a location in data RAM 7c. The operation is as follows. In the first tick, the instruction is read out of the program RAM 5. In the second tick, the read addresses for data RAMs 7a and 7b and the write address for data RAM 7c are generated by the address calculator 6. In the third tick, the read addresses are supplied to the data RAMs 7a, 7b which are enabled by the instruction word on the control line 30 so that the appropriate data samples are read out to pipeline register P3. The write address for data RAM 7c is passed on to pipeline register P3 on the address line extension and propagates through the following pipeline stages with successive ticks. In the fourth tick, the MUX block 9 is controlled to supply the data items read from the data RAMs to the two inputs of the multiplier 11 which then performs the first stage of the multiplication processing. In the fifth tick, the multiplier 11 performs the second stage of the multiplication processing and supplies the product to the pipeline register P5. Bit-shifting of the product is performed by the multiplier shifter in tick 6 under control of the instruction word, and the result is supplied to the pipeline register P6. In the seventh tick, the product is supplied via the ALU 13 to the pipeline register P7. In the eighth tick, the write address wa is supplied to the data RAMs 7 and the multiplexer 14 is controlled to supply the output from the ALU 13 to the data RAMs. During this stage, data RAM 7c is enabled by the control data in the instruction word, whereby the product is written to the appropriate location in this data RAM and the operation is complete.

As part of their operation, the SPICs 4 need to implement various multi-tap or multi-pole filters which operate on the audio data. In order to implement the filter operations, the SPICs 4 need to access previous data items generated during a number of preceding audio sample periods. However, as described above, the read and write addresses for the data RAMs 7 in the SPIC form part of the instructions stored in the program RAM 5, so as a given instruction is read from the program RAM 5 in successive audio sample periods, the same addresses for accessing the data RAMs 7 are generated. Thus, an instruction to write a data item to an address in the data RAMs 7 in a current sample period will, in the next sample period, provide the same address for the corresponding data item in that sample period. To enable corresponding data items from successive sample periods to be available in the data RAMs 7 at the same time, therefore, the data RAMs 7 comprise data storage apparatus an embodiment of which is illustrated schematically in FIG. 5.

Figure 5:
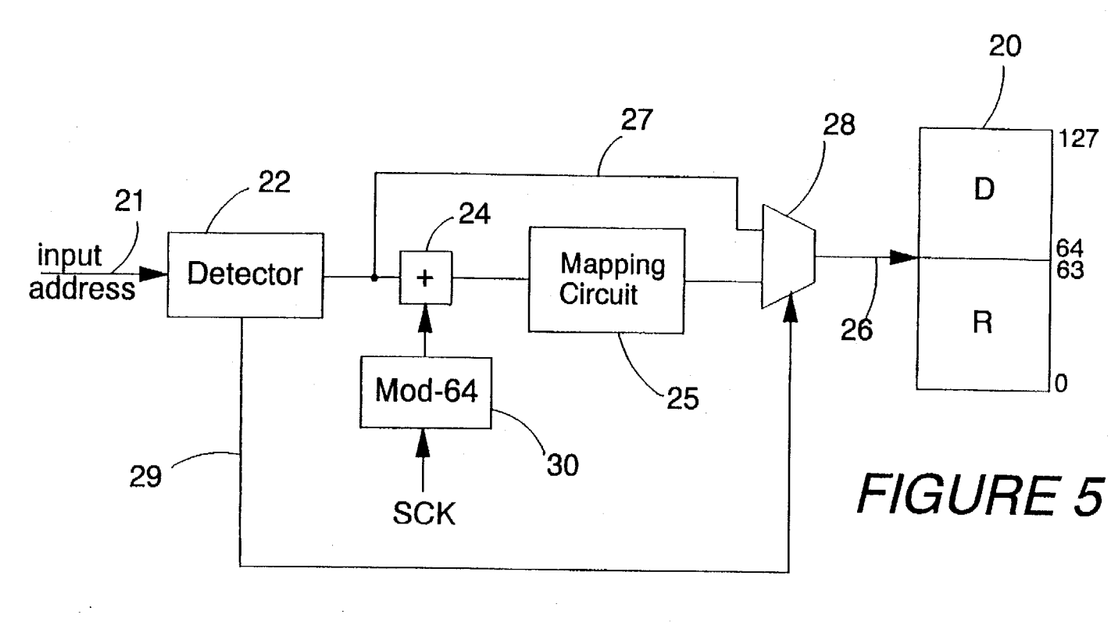
FIG. 5 is a schematic illustration of one embodiment of data storage apparatus in the processor of FIG. 1.

FIG. 5 shows data storage apparatus comprising a memory 20 which corresponds to one of the data RAMs 7a to 7c shown in FIG. 1. Corresponding data storage apparatus, operating in the same manner, is provided for each of the data RAMs 7a to 7c. The apparatus of FIG. 5 has a main input 21 for receiving input addresses from the address calculator 6 of the SPIC. Both the read address input RA and the write address input WA of the data RAM as shown in FIG. 1 are connected to the main input 21 of the apparatus. The input 21 supplies input addresses to a detector 22 from where the input address is supplied to one input of an adder 24 the other input of which receives the count from a modulo-64 counter 30 which is incremented at the audio sample rate by the audio sample clock SCK. Input addresses output by the detector 22 are also supplied directly to one input 27 of a multiplexer 28. The output of the adder 24 is connected to a mapping circuit 25 the output of which is connected to the other input of the multiplexer 28. The output of the multiplexer 28 forms the address input 26 of the memory 20. The multiplexer 28 is controlled by the signal on a control output 29 of the detector 22 to connect one of its inputs to the address input 26 of the memory.

In this embodiment, the memory 20 has 128 addressable locations having addresses 0 to 127. Addresses 0 to 63 form a first, or "rotating", section R of the memory. This section R is adjustably addressed through operation of the address adjustment means formed by the adder 24, counter 30 and mapping circuit 25 as will be described below. The upper section of the memory, containing locations 64 to 127, forms a second section D which is addressed directly using input addresses received on the main input 21 as will be described below.

Section D of the memory 20 is used by the SPIC 4 for storing constants or other data items for which previous values are not required. An instruction in the program RAM 5 to access a location in this section has an address field which is decoded by the address calculator 6 to generate an input address in the range 64 to 127 for the location to be accessed. The input address is supplied via the main input 21 to the detector 22 which identifies the address as having a most significant bit (MSB) of 1 and thus as an address of a location in the direct access section D of the memory 20. The state of the control output 29 of the detector 22 is therefore set to control the multiplexer 28 to connect its input 27 to the memory address input 26. The input address is thus supplied directly to the address input 26 of the memory 20, whereby the appropriate location 64 to 127 is accessed.

Considering now accessing of the rotating section R of the memory 20, when an input address in the range 0 to 63, corresponding to a location in the section R, is supplied to the input 21, the detector 22 detects the MSB of 0 indicating that the address corresponds to a location in the section R. The detector 22 then controls the multiplexer 28 via the control output 29 to connect the output of the mapping circuit 25 to the memory address input 26. The input address is supplied to the adder 24, wherein the count currently held by the modulo-64 counter 30 is added to the input address, and the resulting address value is supplied to the mapping circuit 25. The mapping circuit 25 outputs an adjusted address (which may or may not correspond to the input address value as discussed below), and the adjusted address is supplied to the address input 26 of the memory 20 to access the location in the rotating section R indicated by the adjusted address.

The modulo-64 counter 30 counts from 0 to 63 with successive cycles of the sample clock SCK, i.e. with successive audio sample periods. Since an input address for accessing the rotating section R of the memory will be from 0 to 63, and the count at any time may be from 0 to 63, the address value output by the adder 24 may be greater than 63, i.e. greater than the highest address in the rotating section R of the memory. In such cases, the mapping circuit 25 operates to convert the address value to an adjusted address corresponding to a location in the section R. This is done by considering the locations in the section R as a continuous cycle of locations 0, 1, 2 . . . 62, 63, 0, 1 . . . and so on. The mapping circuit 25 maps an address value higher than 63 on to the corresponding address in this cycle by subtracting 64 (the number of locations in the section R) from the address value. Thus, an address value of 64 will be converted to an adjusted address of 0, an address value of 65 will be converted to an adjusted address of 1, an address value of 66 will be converted to an adjusted address of 2, and so on. Of course, the mapping circuit 25 need only convert input address values higher than 63, input address values of 0 to 63 being directly output as the adjusted address.

The operation of the data storage apparatus of FIG. 5 for storing corresponding data items in a number of successive audio sample periods will now be described. Where, as in the case of implementing a filter operation, corresponding data items in successive audio sample periods must be available in a data RAM 7 at the same time, an instruction in the program RAM 5 to write a current data item to the memory will include a write address field indicating an address from 0 to 63 in the rotating section R. Consider that this instruction is to write the current data item to location address 0, and that for the current audio sample period the count of the modulo-64 counter 30 is also at 0. The input address of 0 is received by the detector 22 which sets the multiplexer 28 to connect the output of the mapping circuit 25 to the memory address input 26. The input address of 0 is supplied to the adder 24, and since the count is also 0, an address value of 0 is supplied to the mapping circuit 25. The mapping circuit 25 thus supplies an address of 0 to the address input 26 of the memory 20 via the multiplexer 28, whereupon the current data item is actually written to location 0 of the rotating section R.

When the same instruction is implemented in the next audio sample period for the corresponding data item, again an input address of 0 is supplied to the detector 22 and hence the adder 24, but the modulo-64 counter 30 then holds a count of 1. The mapping circuit 25 thus receives an address value of 1 which is then output as the address to the memory 20, whereby the data item for this sample period is written to address 1 in the rotating section R. This continues for successive audio sample periods, the instruction always supplying input address 0 to the detector 22 but the count on the modulo-64 counter 30 incrementing by one with each sample period. Corresponding data items in successive audio sample periods are therefore written to successive addresses 0, 1, 2, 3 . . . in the memory 20.

It will be seen from the above that, if the data item for the current sample period at any time is stored by a WRITE instruction at location address n in the rotating section of the memory, the corresponding data items for successive preceding sample periods are stored at locations n-1, n-2, n-3 etc. A READ instruction later in the instruction sequence of the SPIC can read the data item for the current sample period using a read address equal to the write address in the earlier WRITE instruction. In the present example therefore, the READ instruction would contain a read address field corresponding to address 0 in the memory 20, and this address is supplied as the input address to the detector 22 and hence to the adder 24. The current count, i.e. n in the above example, of the counter 30 is added to the input address by the adder 24 so that address n is supplied to the mapping circuit 25 which then outputs address n to the address input 26 of the memory 20 via the multiplexer 28. Thus location n, which contains the data item for the current sample period, is read as required. To access the corresponding data item for the immediately preceding audio sample period, a READ instruction needs to read data from location n-1 of the memory 20. The actual read address in the instruction is obtained by subtracting one from the write address used by the WRITE instruction for writing the current data item to the memory. In this case, the write address is 0, and address 0-1 in the cyclical addressing system is address 63. The read instruction therefore contains an address field which is decoded by the address calculator 6 to generate an input address of 63 which is supplied to the detector 22. Address 63 is therefore supplied to the adder 24 which adds the current count n from the counter 30 to give an address value of 63+n. This address value is supplied to the mapping circuit 25 which subtracts 64 from the address value to output an adjusted address of 63+n−64=n-1. Thus location n-1, containing the data item for the previous audio sample period, is correctly read.

It will be seen from the above that, if a WRITE instruction generates an input address of x for a data item, corresponding data items in successive audio sample periods will be written to addresses x, x+1, x+2 etc. as the count of the modulo 64 counter 30 is incremented from 0 upwards. To read the data item for the current sample period, a read instruction generates an input address of x. To read the corresponding data items from successive preceding sample periods, the read instructions generate input addresses of x−1, x−2, x−3 etc., the instruction programming taking into account the cyclical addressing system where address 63 immediately precedes address 0 as described above.

In the embodiment of FIG. 5, half of the memory 20, and hence half of each data RAM 7a to 7c is rotatably addressed, and half is directly addressed as described. However, requirements for the size of the rotating section, and the relative proportions of the rotating and direct access sections, may vary from application to application and, in this example, from SPIC to SPIC. Accordingly, in preferred embodiments of the invention, the memory is divided into a number of sections one or more, and preferably all, of which can be selected for direct or rotating access as required. Such a preferred embodiment of data storage apparatus is shown in FIG. 6.

Figure 6:
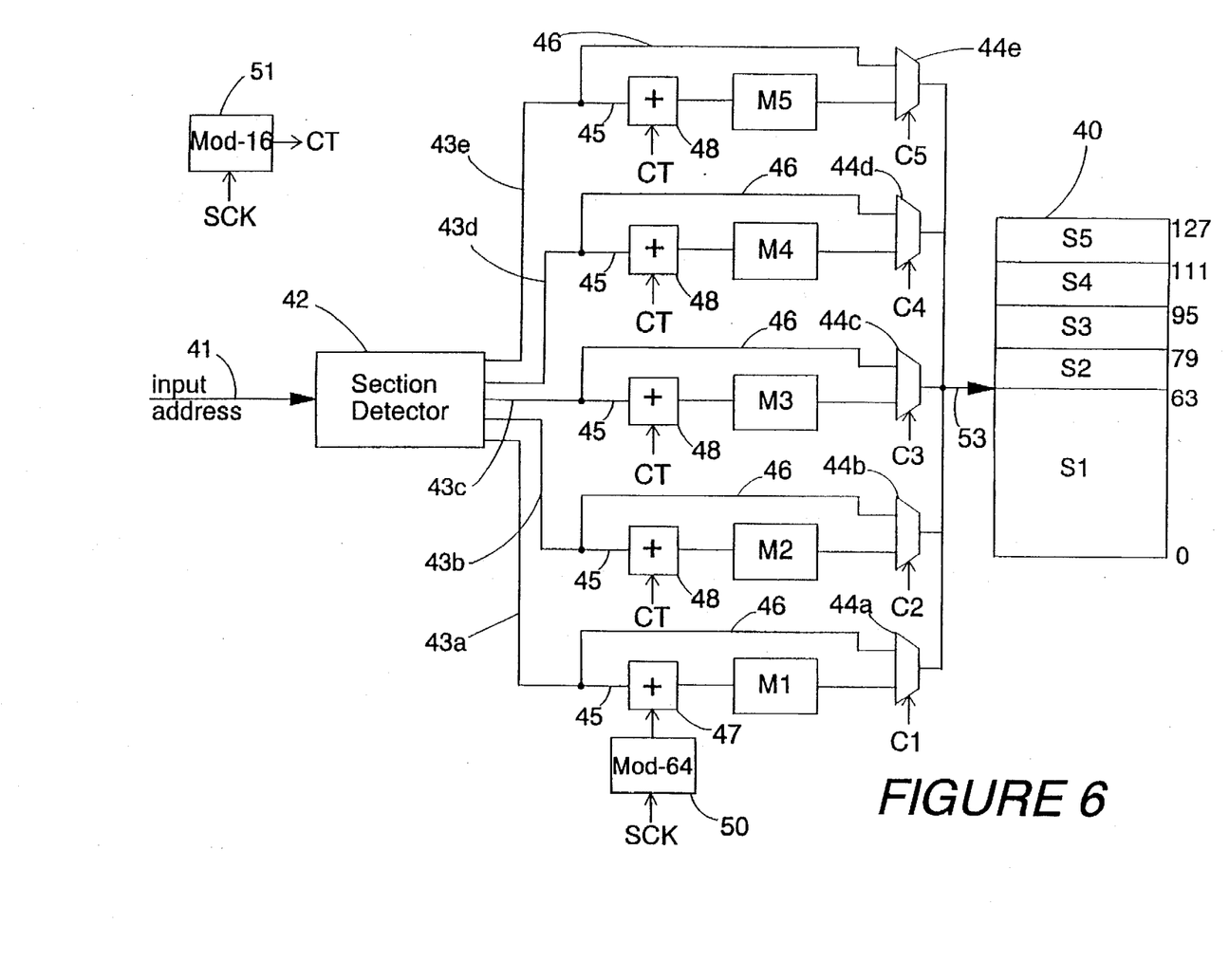
FIG. 6 is a schematic illustration of a further embodiment of data storage apparatus for the processor of FIG. 1.

FIG. 6 shows data storage apparatus comprising a memory 40 which corresponds to one of the data RAMs 7a to 7c of FIG. 1. Again, corresponding data storage apparatus is provided for each of the data RAMs 7a to 7c although only one will be described. The apparatus of FIG. 6 has a main input 41 for receiving input addresses from the address calculator 6. Again, the read and write address inputs RA and WA shown in FIG. 1 are both connected to the input 41 of FIG. 6. The main input 41 supplies input addresses to a section detector 42 which determines to which section of the memory 40 the input address corresponds. In this example, the memory 40 is divided into five sections S1 to S5. Section S1 contains locations 0 to 63, section S2 contains locations 64 to 79, section S3 contains locations 80 to 95, section S4 contains locations 96 to 111, and section S5 contains locations 112 and 127. Thus, section S1 contains 64 locations and each of sections S2 to S5 contains 16 locations.

The section detector 42 identifies from the input address, which will be in the range 0 to 127, to which of the sections S1 to S5 the input address corresponds and then supplies the input address to the appropriate one of five outputs 43a to 43e respectively. The outputs 44a to 44e are connected the inputs 45 of respective adders. The detector output 43a is connected to adder 47, and the detector outputs 43b to 43e are connected to respective adders 48. A second input of the adder 47 is connected to a modulo-64 counter 50 in view of the 64 locations in the lower section S1 of the memory 40. The counter 50 is incremented at the audio sample rate by the clock signal SCK. The second inputs of each of the four adders 48 are connected to receive the count CT output by a modulo-16 counter 51, again incremented by SCK, in view of the 16 locations in each of the sections S2 to S5 of the memory 40.

The outputs of the adders 47 and 48 are connected to respective mapping circuits M1 to M5 as shown, and the outputs of the mapping circuits M1 to M5 are connected to the inputs of respective multiplexers 44a to 44e. The outputs of the multiplexers 44a to 44e are connected to the address input 53 of the memory 40. The detector outputs 43a to 43e are also connected directly to the second inputs 46 of the respective multiplexers 44a to 44e, thus bypassing the adders 47, 48 and mapping circuits M1 to M5. Which of the two inputs to each multiplexer 44a to 44e is connected to its output is determined by the state of a corresponding control signal C1 to C5 supplied thereto.

Each of the sections S1 to S5 of the memory 40 can be rotatably or directly addressed in dependence upon the state of the corresponding multiplexer 44a to 44e which is in turn determined by the state of the corresponding control signal C1 to C5. Each control signal C1 to C5 can be represented by a single bit, 0 or 1 depending on the required state of the multiplexer. The control bits C1 to C5 are set in the control processor 26 (FIG. 1) in dependence upon the memory requirements of the particular SPIC and are supplied by the control processor 26 to the data RAMs 7 of each SPIC.

When the multiplexer 44a to 44e corresponding to a section S1 to S5 of the memory 40 is set for rotating address access, i.e. with the multiplexer connecting the output of the associated mapping circuit to the memory address input 53, then addressing of the section is performed in an equivalent manner to that described for the rotating section R of FIG. 5. Considering first section S1, an input address x in the range 0 to 63 will be supplied via the section detector 42 to its output 43a and hence to the adder 47. The address will therefore be added to the current count of the modulo-64 counter 50 and the resulting address value output to the mapping circuit M1. The mapping circuit M1 operates in the same way as the circuit 25 of FIG. 5. That is, address values of 0 to 63 output by the adder 47 will be supplied via the multiplexer 44a to the address input 53 for accessing the section S1 of the memory. However, for address values greater than 63, the mapping circuit M1 will subtract 64 from the address value to output an adjusted address corresponding to a location 0 to 63 in the section S1.

The mapping circuits M2 to M5 operate in a similar manner for the sections S2 to S5, although in this case the mapping is performed within the 16 memory locations in the corresponding section. Considering section S3, for example, this section will be accessed when an input address in the range 80 to 95 is received by the section detector 42. The section detector 42 supplies the input address to its output 43c, and hence to the adder 48. The current count of the modulo-16 counter 51 is added to the input address in the adder 48, and the resulting address value is supplied to the mapping circuit M3. If the address value output by the adder 48 exceeds 95 (the highest address location in section S3), the mapping circuit M3 subtracts 16 from the address value to output an adjusted address corresponding to the location in section S3 to be accessed. With the multiplexer 44c set for rotating address access, the address output by the mapping circuit is supplied to the memory address input 53.

As previously described, any one or more of the sections S1 to S5 can be switched to direct access mode by the appropriate control signals C1 to C5. In the direct access mode, the adjustment performed by the adder 47 or 48 is bypassed, and an input address on the multiplexer input 46 is supplied by the multiplexer directly to the address input 53 of the memory 40 for accessing the corresponding location.

Use in the SPIC 4 of the sections S1 to S5 of the memory 40 in the rotating mode for accessing previous data items is entirely equivalent to the method described with reference to FIG. 5. It will be appreciated, however, that the division of the memory 40 into a plurality of sections S1 to S5, each of which can be set for rotating or direct access, greatly increases the flexibility of the apparatus. The proportion of rotating to direct access memory can be set by the control bits C1 to C5 in dependence upon the particular requirements of a given SPIC, and can therefore be varied from SPIC to SPIC. Equally, while the same control bits C1 to C5 may be used to control the access mode for all three of the data RAMs 7a to 7c in the SPIC, a separate set of control bits C1 to C5 may be provided for each data RAM so that the proportion of rotating to direct access memory can be different in each case.

It will of course be appreciated that, while data storage apparatus embodying the invention has been described above in relation to a particular audio data processing application, embodiments of the invention may be used in many other applications.

Further, although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Data storage apparatus comprising:
a memory having a plurality of addressable memory locations for storage of data items and memory address input means for receiving addresses of locations to be accessed;
main input means for receiving an input address corresponding to a memory location;
a modulo-n counter for changing a count in response to a clock signal, wherein n is the number of locations in the memory;
address adjustment means for combining the count with an input address to generate an adjusted address corresponding to a memory location and supplying the adjusted address to the memory address input means; and
means for accessing the memory location at the address supplied to the memory address input means.

2. Apparatus as claimed in claim 1, wherein the counter increments the count in response to the clock signal and wherein the address adjustment means is arranged to add the count to an input address.

3. Apparatus as claimed in claim 1, wherein the main input means includes means for identifying whether an input address corresponds to a location in a first section of the memory containing a subset of the memory locations, the main input means being arranged to supply input addresses corresponding to locations in the first section to the address adjustment means, and to supply other input addresses to the memory address input means;
wherein the counter increments the count in response to the clock signal and wherein the address adjustment means is arranged to add the count to an input address; and
wherein the address adjustment means includes mapping means for receiving the address value obtained through adding the count to the input address and, if the address value is greater than the highest address of a memory location in the first section, reducing the address value by the number of locations in the first section until an adjusted address corresponding to a memory location in the first section is obtained.

4. Apparatus as claimed in claim 1, wherein the address adjustment means includes mapping means for receiving the address value obtained through combining the count with the input address and, if the address value is outside the range of memory location addresses, converting the address value to an adjusted address corresponding to a memory location.

5. Apparatus as claimed in claim 1, wherein the counter increments the count in response to the clock signal and wherein the address adjustment means is arranged to add the count to an input address; and wherein the address adjustment means includes mapping means for receiving the address value obtained through adding the count to the input address and, if the address value is greater than the highest address of a memory location, reducing the address value by the number of locations in the memory until an adjusted address corresponding to a memory location is obtained.

6. Apparatus as claimed in claim 1, wherein the main input means includes means for identifying whether an input address corresponds to a location in a first section of the memory containing a subset of the memory locations, the main input means being arranged to supply input addresses corresponding to locations in the first section to the address adjustment means, and to supply other input addresses to the memory address input means.

7. Apparatus as claimed in claim 6, wherein the counter is a modulo-p counter where p is the number of locations in the first section of the memory.

8. Apparatus as claimed in claim 6, wherein the address adjustment means includes mapping means for receiving the address value obtained through combining the count with the input address and, if the address value is outside the range of addresses of memory locations in the first section, converting the address value to an adjusted address corresponding to a memory location in the first section.

9. Apparatus as claimed in claim 6, including bypass means for switching out the address adjustment means in response to a control signal such that input addresses output by the main input means to the address adjustment means are supplied, unmodified by the count, to the memory address input means.

10. Apparatus as claimed in claim 1, wherein the memory comprises a plurality of sections each containing a subset of the memory locations, the apparatus including, for each of the sections, address adjustment means arranged to combine a count, which is changed in response to a clock signal, with an input address supplied thereto to generate an adjusted address and to supply the adjusted address to the memory address input means, and wherein the main input means includes means for identifying the section of the memory containing the location corresponding to an input address and supplying the input address to the adjustment means for that section.

11. Apparatus as claimed in claim 10, wherein the count is incremented by a counter in response to the clock signal, and wherein the address adjustment means is arranged to add the count to the input address.

12. Apparatus as claimed in claim 10, wherein the memory address input means is a single address input for addressing all locations in the memory.

13. Apparatus as claimed in claim 10, wherein separate address adjustment means is provided for each section of the memory.

14. Apparatus as claimed in claim 10, wherein the adjustment means for each section receives the count from a modulo-p counter where p is the number of locations in that section.

15. Apparatus as claimed in claim 10, wherein the adjustment means for each section includes mapping means for receiving the address value obtained through combining the count with the input address, and, if the address value is outside the range of addresses of locations in that section, converting the address value to an adjusted address corresponding to a location in that section.

16. Apparatus as claimed in claim 10, wherein the count is incremented by a counter in response to the clock signal, and wherein the address adjustment means is arranged to add the count to the input address; and wherein the adjustment means for each section includes mapping means for receiving the address value obtained through adding the count to the input address and, if the address value is greater than the highest address of a memory location in that section, reducing the address value by the number of memory locations in that section until an adjusted address corresponding to a location in that section is obtained.

17. Apparatus as claimed in claim 10, including bypass means for switching out the address adjustment means for a section of the memory in response to a control signal for that section such that input addresses output by the main input means to the adjustment means for that section are supplied, unmodified by the count, to the memory address input means.

18. Apparatus as claimed in claim 10, wherein at least some of the sections contain the same number of memory locations.

19. A data processing method for processing digital data samples, comprising the steps of:

performing a sequence of processing operations in each data sampling period in accordance with a predetermined sequence of instructions, at least one of said operations including accessing a memory having a plurality of addressable memory locations for storage of data items through a memory access method, said memory access method including the steps of generating an input address corresponding to a location of the memory; changing a count in response to a clock signal; combining the input address with the count to generate an adjusted address corresponding to a memory location; and accessing the memory location corresponding to the adjusted address;

writing a current data sample to said memory location, wherein said input address for the memory write access operation is indicated by the instruction for that operation and wherein said clock signal is the data sample clock signal, whereby a previous data sample corresponding to said current data sample can be read from the memory using said memory access method for an input address corresponding to that for the write access operation but from which a value equal to the number of data sample periods between storage of the current and previous samples has been subtracted.

20. A data processor for processing digital data samples, comprising:

at least one data storage apparatus, said data storage apparatus including a memory having a plurality of addressable memory locations for storage of data items and memory address input means for receiving addresses of locations to be accessed; main input means for receiving an input address corresponding to a memory location; a counter for changing a count in response to a clock signal; address adjustment means for combining the count with an input address to generate an adjusted address corresponding to a memory location and supplying the adjusted address to the memory address input means; and means for accessing the memory location at the address supplied to the memory address input means;

wherein said clock signal is the data sample clock signal, and wherein the processor is arranged to perform a sequence of operations in each period of the clock signal in accordance with a sequence of instructions stored in a program store of the processor, at least some of the said instructions including address data corresponding to input addresses to be supplied to the data storage apparatus for accessing the memory.

21. A data processor as claimed in claim 20, wherein said digital data samples are digital audio samples.

22. A method for accessing a memory having a plurality of addressable memory locations for storage of data items, the method comprising:

generating an input address corresponding to a location of the memory;

changing a count in response to a clock signal, wherein said counter is a modulo-n counter and wherein n is the number of locations in the memory;

combining the input address with the count to generate an adjusted address corresponding to a memory location; and accessing the memory location corresponding to the adjusted address.

23. A method as claimed in claim 22 including identifying whether the input address corresponds to a location in a first section of the memory and if so generating the adjusted address for accessing the memory, and otherwise accessing the memory location corresponding to the input address.

24. A method as claimed in claim 23 wherein, for the said first section of the memory, a modulo-p counter is incremented by the clock signal to generate the count, where p is the number of memory locations in that section, and the adjusted address is generated by adding the count to the input address.

25. A method as claimed in claim 22 wherein the memory comprises a plurality of sections each containing a subset of the memory locations, the method including identifying the section of the memory containing the location corresponding to an input address, and, in dependence on the state of a control signal for that section, either generating an adjusted address for accessing that section or accessing the location corresponding to the input address.

26. A method as claimed in claim 25 wherein, for each said section of the memory, a modulo-p counter is incremented by the clock signal to generate the count, where p is the number of memory locations in that section, and the adjusted address is generated by adding the count to the input address.

27. Data storage apparatus comprising:

a memory having a plurality of addressable memory locations for storage of data items and memory address input means for receiving addresses of locations to be accessed;

main input means for receiving an input address corresponding to a memory location;

a counter for changing a count in response to a clock signal;

address adjustment means for combining the count with an input address to obtain an address value and to generate an adjusted address corresponding to a memory location and supplying the adjusted address to the memory address input means; and means for accessing the memory location at the address supplied to the memory address input means;

wherein the address adjustment means includes mapping means for receiving the address value obtained through combining the count with the input address and, if the address value is outside the range of memory location addresses, converting the address value to an adjusted address corresponding to a memory location.

28. Apparatus as claimed in claim 27, wherein the counter increments the count in response to the clock signal and wherein the address adjustment means is arranged to add the count to an input address to obtain an address value; and wherein the address adjustment means includes mapping means for receiving the address value obtained through adding the count to the input address and, if the address value is greater than the highest address of a memory location, reducing the address value by the number of locations in the memory until an adjusted address corresponding to a memory location is obtained.

29. Apparatus as claimed in claim 27, wherein the main input means includes means for identifying whether an input address corresponds to a location in a first section of the memory containing a subset of the memory locations, the main input means being arranged to supply input addresses corresponding to locations in the first section to the address adjustment means, and to supply other input addresses to the memory address input means.

30. Apparatus as claimed in claim 29, wherein the address adjustment means includes mapping means for receiving the address value obtained through combining the count with the input address and, if the address value is outside the range of addresses of memory locations in the first section, converting the address value to an adjusted address corresponding to a memory location in the first section.

31. Apparatus as claimed in claim 29, including bypass means for switching out the address adjustment means in response to a control signal such that input addresses output by the main input means to the address adjustment means are supplied, unmodified by the count, to the memory address input means.

32. Apparatus as claimed in claim 29, wherein the counter is a modulo-p counter, where p is the number of locations in the first section of the memory.

33. Apparatus as claimed in claim 27, wherein the main input means includes means for identifying whether an input address corresponds to a location in a first section of the memory containing a subset of the memory locations, the main input means being arranged to supply input addresses corresponding to locations in the first section to the address adjustment means, and to supply other input addresses to the memory address input means;

wherein the counter increments the count in response to the clock signal and wherein the address adjustment means is arranged to add the count to an input address to obtain an address value; and wherein the address adjustment means includes mapping means for receiving the address value obtained through adding the count to the input address and, if the address value is greater than the highest address of a memory location in the first section, reducing the address value by the number of locations in the first section until an adjusted address corresponding to a memory location in the first section is obtained.

34. Apparatus as claimed in claim 27, wherein the memory comprises a plurality of sections each containing a subset of the memory locations, the apparatus including, for each of the sections, address adjustment means arranged to combine a count, which is changed in response to a clock signal, with an input address supplied thereto to generate an adjusted address and to supply the adjusted address to the memory address input means, and wherein the main input means includes means for identifying the section of the memory containing the location corresponding to an input address and supplying the input address to the adjustment means for that section.

35. Apparatus as claimed in claim 34, wherein at least some of the sections contain the same number of memory locations.

36. Apparatus as claimed in claim 34, wherein the memory address input means is a single address input for addressing all locations in the memory.

37. Apparatus as claimed in claim 34, wherein the count is incremented by a counter in response to the clock signal, and wherein the address adjustment means is arranged to add the count to the input address.

38. Apparatus as claimed in claim 34, wherein a separate address adjustment means is provided for each section of the memory.

39. Apparatus as claimed in claim 34, wherein the adjustment means for each section receives the count from a modulo-p counter where p is the number of locations in that section.

40. Apparatus as claimed in claim 34, wherein the adjustment means for each section includes mapping means for receiving the address value obtained through combining the count with the input address, and, if the address value is outside the range of addresses of locations in that section, converting the address value to an adjusted address corresponding to a location in that section.

41. Apparatus as claimed in claim 34, wherein the count is incremented by a counter in response to the clock signal, and wherein the address adjustment means is arranged to add the count to the input address to obtain an address value; and wherein the adjustment means for each section includes mapping means for receiving the address value obtained through adding the count to the input address and, if the address value is greater than the highest address of a memory location in that section, reducing the address value by the number of memory locations in that section until an adjusted address corresponding to a location in that section is obtained.

42. Apparatus as claimed in claim 34, including bypass means for switching out the address adjustment means for a section of the memory in response to a control signal for that section such that input addresses output by the main input means to the adjustment means for that section are supplied, unmodified by the count, to the memory address input means.

43. A method for accessing a memory having a plurality of addressable memory locations for storage of data items, comprising the steps of:

generating an input address corresponding to a location of the memory;

changing a count in response to a clock signal;

combining the input address with the count to generate an adjusted address corresponding to a memory location; and identifying whether the input address corresponds to a location in a first section of the memory and, if so, accessing the memory location corresponding to the adjusted address and, if not, accessing the memory location corresponding to the input address.

44. A method as claimed in claim 43, wherein for said first section of the memory, a modulo-p counter is incremented by the clock signal to generate the count, where p is the number of memory locations in said first section, and the adjusted address is generated by adding the count to the input address.

45. A method as claimed in claim 43 wherein the memory comprises a plurality of sections each containing a subset of the memory locations, and further comprising the step of identifying the section of the memory containing the location corresponding to an input address, and, in dependence on the state of a control signal for that section, either generating an adjusted address for accessing that section or accessing the location corresponding to the input address.

46. A method as claimed in claim 45, wherein for each said section of the memory, a modulo-p counter is incremented by the clock signal to generate the count, where p is the number of memory locations in that section, and the adjusted address is generated by adding the count to the input address.

* * * * *

UNITED STATES PATENT AND TRADEMARK OFFICE
CERTIFICATE OF CORRECTION

PATENT NO. : 5,765,219
DATED : June 9, 1998
INVENTOR(S) : Densham et al.

It is certified that error appears in the above-identified patent and that said Letters Patent is hereby corrected as shown below:

On the title page: Item [30] to read as follows:

Foreign Application Priority Data

Feb. 23, 1995 [GB] United Kingdom ........ 9503671

Signed and Sealed this

Tenth Day of November 1998

Attest:

BRUCE LEHMAN

*Attesting Officer*     *Commissioner of Patents and Trademarks*